United States Patent [19]
Shou et al.

[11] Patent Number: 5,926,512
[45] Date of Patent: Jul. 20, 1999

[54] MATCHED FILTER CIRCUIT

[75] Inventors: Guoliang Shou; Changming Zhou; Makoto Yamamoto; Sunao Takatori, all of Tokyo; Mamoru Sawahashi, Kanagawa; Fumiyuki Adachi, Yokohama, all of Japan

[73] Assignees: Yozan Inc.; NTT Mobile Communications Network, Inc., both of Tokyo, Japan

[21] Appl. No.: 08/735,787

[22] Filed: Oct. 23, 1996

[30] Foreign Application Priority Data

Oct. 23, 1995 [JP] Japan .................................. 7-299197

[51] Int. Cl.⁶ .............................. H03D 1/00; H04L 27/06
[52] U.S. Cl. .......................... 375/343; 375/200; 375/208; 364/825
[58] Field of Search ..................................... 375/200, 206, 375/207, 343; 364/724.011, 724.11, 825; 327/91, 94; 341/122, 124

[56] References Cited

U.S. PATENT DOCUMENTS

| | | |
|---|---|---|
| 4,507,746 | 3/1985 | Fletcher, Jr. . |
| 4,725,972 | 2/1988 | Gockler .................................... 364/724 |
| 5,016,255 | 5/1991 | Dixon et al. ............................. 375/200 |
| 5,022,047 | 6/1991 | Dixon et al. ............................. 375/200 |
| 5,293,398 | 3/1994 | Hamao et al. ........................... 375/200 |
| 5,388,063 | 2/1995 | Takatori . |
| 5,396,446 | 3/1995 | Shou . |
| 5,408,192 | 4/1995 | Bailey . |
| 5,424,973 | 6/1995 | Shou . |
| 5,500,810 | 3/1996 | Shou . |
| 5,502,664 | 3/1996 | Shou . |
| 5,563,812 | 10/1996 | Shou . |
| 5,686,861 | 11/1997 | Shou . |
| 5,737,368 | 4/1998 | Shou . |
| 5,740,096 | 4/1998 | Shou . |
| 5,751,184 | 5/1998 | Shou . |
| 5,757,845 | 5/1998 | Fukawa et al. ......................... 375/200 |
| 5,781,584 | 7/1998 | Zhou . |
| 5,790,590 | 8/1998 | Shou . |

OTHER PUBLICATIONS

Takana et al., "Development of Low Power Consumption LSI for SS Communication," Technical Report of IEICE, SST95–77 (1995–10), pp. 31–36, The Institute of Electronica, Information and Communication Engineers, 1995.

Ogawa et al., "Development of 1 Chip SS Communication LSI Using Digital Matched Filgers," Technical Report of IEICE, ISEC92–42, SST94–65 (1994–12), pp. 33–38, The Institute of Electronica, Information and Communication Engineers, 1994.

"Dual 64–TAP, 11 Mcps, Digital Matched Filter/Correlator, STEL–3310," Stanford Telecommunications, ASIC & Custom Products Group, pp. 126 and 130.

Povey et al., "Simplified Matched Filter Receiver Designs for Spread Spectrum Communications Applications", Electronics & Communication Engineering Journal, vol. 5, No. 2, Apr. 1, 1993.

*Primary Examiner*—Jason Chan
*Assistant Examiner*—Jean B. Corrielus
*Attorney, Agent, or Firm*—Pillsbury Madison & Sutro LLP

[57] ABSTRACT

A matched filter circuit for mobile communications is disclosed. The circuit may be fabricated in a small size using large-scale integration and can perform high-speed processing and double sampling at a reduced rate of power consumption. In one embodiment, a plurality of sampling and holding circuits each including a switch are divided into two groups. A control circuit successively closes one of the switches in the first group every chip time, while successively closing one of the switches in the second group at a timing shifted by one-half chip time from that of the first group, thereby enabling a double-sampling operation. Outputs of the sampling and holding circuits in each group are summed by an analog circuit with a high degree of linearity, resulting in a high processing speed combined with a reduced circuit size and power consumption.

21 Claims, 6 Drawing Sheets

MATCHED FILTER CIRCUIT

FIELD OF THE INVENTION

The present invention relates to a matched filter circuit for a spread spectrum communication system for mobile communications or a wireless LAN, and especially to a matched filter which is capable of high speed processing and double-sampling in a LSI circuit of small size and reduced power consumption.

BACKGROUND OF THE INVENTION

A matched filter circuit is a filter for judging the correspondence of two signals. In spread spectrum communications, a unique spreading code sequence is allocated to each user. The user finds a signal transmitted for that user by using a matched filter to which the user's own spreading code sequence is applied. When the signal received is coded for the user, the matched filter outputs a correlation peak for acquisition and holding.

Assuming a spreading code to be PN(i), a chip time to be Tc, a spreading ratio to be M, a time to be (t), an input signal at a time t to be S(t), and a correlational output signal at a time t to be R(t), the formula (1) can be obtained.

$$R(t)=\Sigma_{i=0}^{M-1} PN(i) \cdot S(t-i \cdot Tc) \quad (1)$$

Here, PN(i) is a 1 bit data sequence for each of the M possible values of i.

As a double or higher order of sampling is necessary for the acquisition, the calculation of the formula (1) is performed in a plurality of systems at the same time using a plurality of matched filter circuits, and the various calculation results are added. In order to realize such a matched filter, a digital circuit or a SAW (Surface Acoustic Wave) device was conventionally used. However, in using a digital circuit, the electric power consumption was large because the size of the circuit was large, and therefore it was not appropriate for mobile communications. In using a SAW element, it was not easy to realize a whole circuit by an element and the S/N ratio was low.

Since the spreading code for each value of i is a 1 bit string, the inventors proposed a matched filter, in the Japanese patent application No. 7-212438, that yields high-speed processing in a small-size and low power consumption LSI configuration by the following method: i) sampling and holding input signals as analog signals of time series, ii) branching out these signals into the signal groups "1" and "−1" by a multiplexer, and iii) adding the signals in each group in parallel by a capacitive coupling.

However, there was no clear suggestion in this application with respect to double-sampling.

SUMMARY OF THE INVENTION

Accordingly, an object of the present invention is to provide a matched filter circuit for performing double-sampling.

In a matched filter circuit according to the present invention, sampling and holding circuits are classified into two groups, and the control circuit successively closes one of the switches in the first group every chip time and at the same time successively closes one of the switches in the second group at a timing shifted by ½ chip time from the timing of the first group.

PREFERRED EMBODIMENT OF THE PRESENT INVENTION

Hereinafter the first embodiment of the matched filter circuit according to the present invention is described with reference to the attached drawings.

Figure 1:
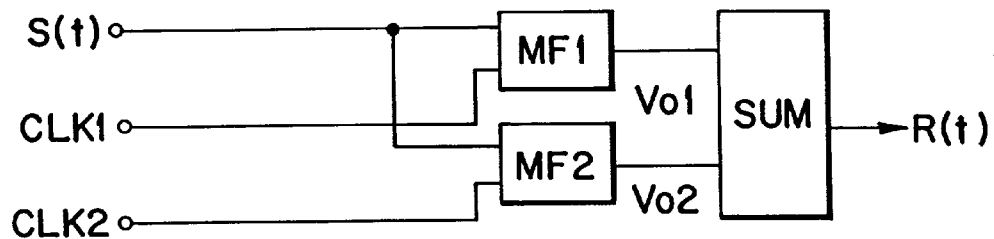
FIG. 1 shows a block diagram of an embodiment of the matched filter circuit according to the present invention.

In FIG. 1, a receiver system for spread spectrum communications includes a plurality of matched filter circuits MF1 and MF2, outputs Vo1 and Vo2 of which are added by an adder SUM. A main clock CLK1 and a sub-clock CLK2 which are shifted by a half of a chip time Tc/2 from each other are inputted to MF1 and MF2. MF1 and MF2 perform correlational calculations adopting the clocks as sampling clocks; that is, double-sampling is performed.

Figure 12:
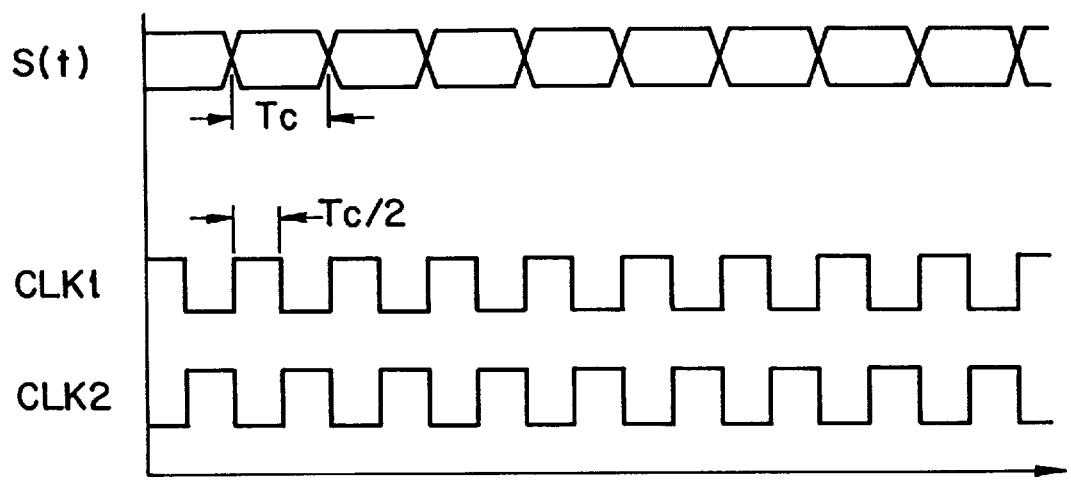
FIG. 12 illustrates the relationship of the timing of an input signal and clocks.

FIG. 12 shows timings of S(t), CLK1 and CLK2. One cycle of S(t) coincides with the chip time. CLK1 and CLK2 are signals of the same cycle as S(t). As shown in FIG. 12, CLK1 and CLK2 are theoretically synchronous with S(t); however, there are many cases where a phase difference occurs on S(t). The phases of CLK1 and CLK2 are shifted by Tc/2 and are inverted by two clocks shifted by Tc/2 (double-sampling) so that a correlational peak can be surely detected.

Figure 2:
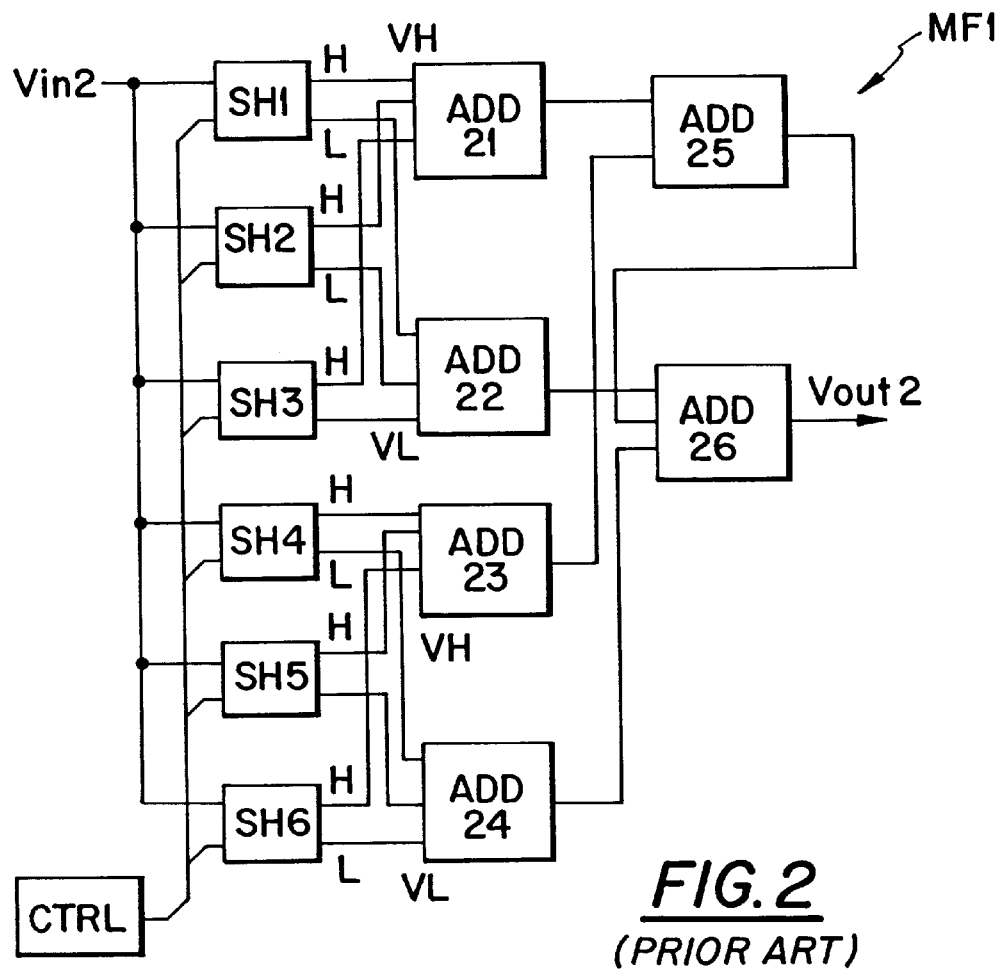
FIG. 2 shows a block diagram of a calculation portion of each matched filter circuit in the embodiment.

In FIG. 2, in the calculating portion MF1 of the matched filter circuit, an input voltage Vin2 is parallelly connected to a plurality of sampling and holding circuits SH1, SH2, SH3, SH4, SH5, and SH6, and two types of output [H (high) and L (low)] are generated from each sampling and holding circuit. A control circuit CTRL is connected to the sampling and holding circuit so as to control S(t) to be inputted to one of the sampling and holding circuits in a successive manner.

The sampling and holding circuit introduces the input voltage Vin2 to either the H side or L side, according to the control of the control circuit. A reference voltage Vr is connected by the control circuit to the other side. This route selection is performed according to each bit of spreading code (PN code), and a multiplication of the input voltage by the code is accomplished only by this selection.

Figure 3:
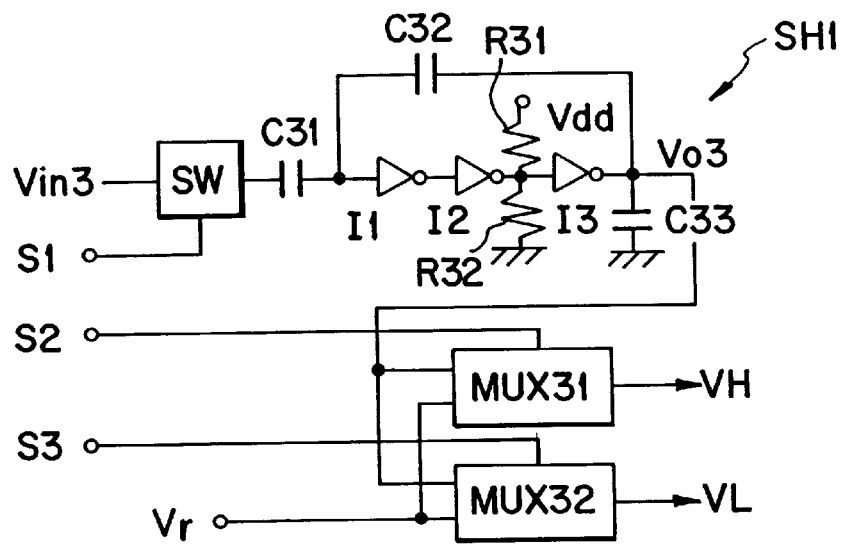
FIG. 3 shows a sampling and holding circuit in FIG. 2.

The sampling and holding circuit SH1 is structured as in FIG. 3, in which an input voltage Vin3 is connected to a switch SW. An output of switch SW is connected to capacitance C31, and three stages of serial MOS inverters I1, I2, and I3 are connected to an output of capacitance C31. An output of MOS inverter I3 of the last stage is connected to an input of I1 through feedback capacitance C32. Consequently, an inversion of Vin is generated at the output of I3 with a good linearity. An output of I3 is inputted to two multiplexers MUX31 and MUX32. A common reference voltage Vr is connected to the multiplexers. When SW is closed, C31 is charged by an electric charge corresponding to Vin3, and the linearity of an output is guaranteed by a feed-back function of I1 to I3. When a switch SW is opened after it, sampling and holding circuit SH1 holds S(t).

Switch SW1 and multiplexers MUX31 and MUX32 are controlled by control signals S1, S2, and S3, respectively. After S1 is once closed, SW is opened at the timing of sampling of the input voltage. The signals S2 and S3 are inverted. When one of the multiplexers outputs Vin, the other outputs Vr.

MUX31 generates an output of H (high type) above and MUX32 generates an output of L (low type). H and L correspond to each bit of the spreading codes "1" and "−1", respectively. When the code "1" is to be multiplied to an input voltage, Vin3 is outputted from MUX31, and when the code "−1" is to be multiplied, Vin3 is outputted from MUX32.

The output from I3 of the last stage is connected to the ground through a grounded capacitance C33. The output of I2 of the second stage is connected to the supply voltage Vdd and the ground through a pair of balancing resistances R31 and R32. Unstable oscillations of an inverted amplifying circuit including a feedback circuit are thereby prevented.

Figure 4:
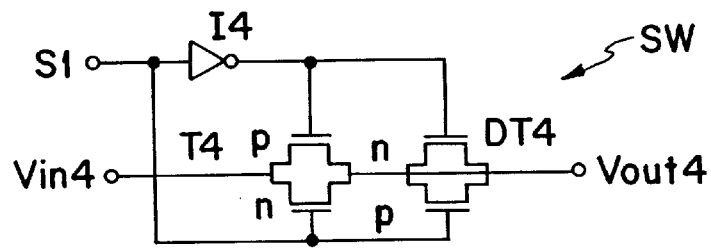
FIG. 4 shows a switch in FIG. 3.

As shown in FIG. 4, the switch SW includes a transistor circuit T4 in which a source and a drain of a n-type MOS transistor are connected to a drain and a source of a p-type MOS transistor, respectively. Vin4 is connected to a terminal of a drain of the nMOS transistor, and a terminal of a source of the nMOS transistor is connected to an output terminal Vout4 through a dummy transistor DT4 similar to the nMOS transistor. S1 is inputted to the gate of the nMOS transistor of the transistor circuit T4, and an inversion of S1 by an inverter I4 is inputted to the gate of the pMOS transistor. When S1 is high level, T4.conducts and when it is low level, T4 is cut off.

Figure 5:
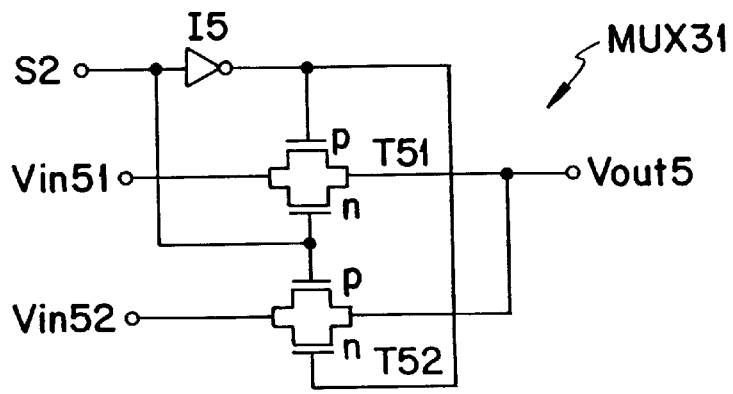
FIG. 5 shows a multiplexer in FIG. 3.

As shown in FIG. 5, in multiplexer MUX31, the terminal of the source of the nMOS transistor of circuits T51 and T52 is connected to the common output terminal Vout5. An output Vo3 ("Vin51" in FIG. 5) of the MOS inverter I3 is connected to a terminal of a drain of the nMOS transistor of T51, and the reference voltage Vr ("Vin52" in FIG. 5) is connected to a drain of the transistor of T52. The signal S2 is inputted to a gate of the nMOS transistor of transistor circuit T51 and a gate of the pMOS transistor of transistor circuit T52. The signal S2 inverted by inverter I5 is inputted to gates of the pMOS transistor of T51 and the nMOS transistor of T52. When S2 is high level, T51 conducts and T52 is cut off, and when low level, T52 conducts and T51 is cut off. That is, MUX31 can alternatively output Vo3 or Vr in response to the control signal S2. Though it is not shown in the figure, multiplexer MUX32 is structured similarly to MUX31 and Vo3 and Vr are connected inversely. Vr and Vo3 of FIG. 5 are connected to T51 and T52, respectively, contrary to the construction of FIG. 5. Consequently, MUX32 behaves inversely to MUX31; that is, when MUX31 outputs Vo3, MUX32 outputs Vr and when MUX31 outputs Vr, MUX32 outputs Vo3.

Signal S2 corresponds to the spreading code and outputs 1×Vin2=Vin2 to ADD21 when S2=1. At this time, S3 is −1 and Vr (corresponding to 0) is outputted to ADD22. When S2=−1, Vr (corresponding to 0) is outputted to ADD21. Here S3=+1 and outputs 1×Vin2=Vin2 to ADD22.

The S(t-i·Tc) in the formula (1) is an input voltage held in each sampling and holding circuit, and PN(i) is the signal S2 (spreading code) to be inputted to each sampling and holding circuit. The order of the spreading codes is predetermined and corresponds to the order of the input signals. When a new signal is taken, the oldest signal is substituted by the newest signal. This causes a change in the relationship between each sampling and holding circuit SH1 to SH6 and PN(i), so PN(i) is shifted by the control circuit. When a code shift is not performed, code transfer will occur through successive sampling and holding circuits and some errors may be generated due to data transfer. It will be understood that the code shift is effective to prevent errors during data transfer.

The summation in formula (1) is performed in the addition portions ADD21 to ADD26, wherein output voltages VH and VL of each sampling; and holding circuit are accumulated in ADD25 and ADD26, respectively. This summation is not performed directly. The sampling and holding circuits are divided into a plurality of groups, and outputs VH and VL are first accumulated in ADD21 to ADD24 by group. Then all of the outputs of ADD21 and ADD23 for accumulating VH are inputted to ADD25, and all of the outputs of ADD22 and ADD24 for accumulating VL are inputted to ADD26. Further, an output of ADD25 is also inputted to ADD26. In FIG. 2, six sampling and holding circuits are shown as divided into two groups with three circuits. Generally a spreading code includes from 100 to several hundred or more bits, and the number of sampling and holding circuits is set to be an appropriate quantity.

Figure 6:
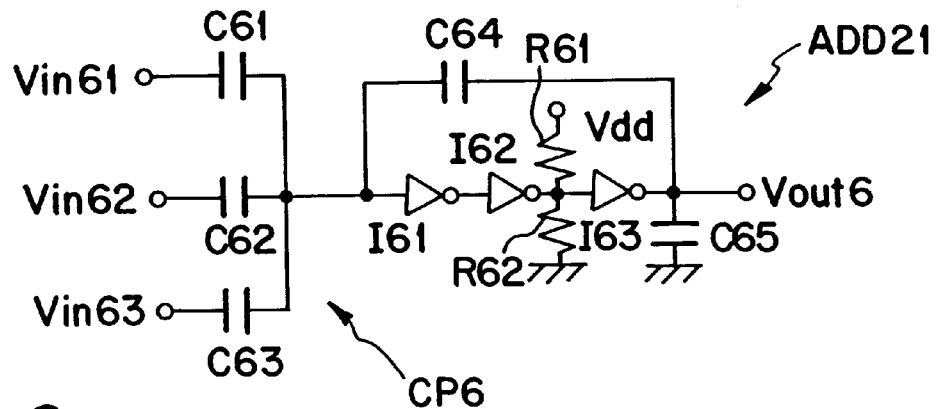
FIG. 6 shows the first adder in FIG. 2.

As shown in FIG. 6, the addition portion ADD21 includes a capacitive coupling CP6 constructed by capacitances C61, C62, and C63 of a number equal to the number of sampling and holding circuits in one group. An output of CP6 is connected to three serial stages of MOS inverters I61, I62, and I63. An output of MOS inverter I3 of the last stage is connected to an input of I61 through a feedback capacitance C64. An output of CP6 is generated at an output of I63 with a good linearity. Assuming input voltages of capacitances C61, C62, and C63 to be Vin61, Vin62, and Vin63, an output Vout6 of I63 can be expressed by the formula (2).

$$\text{Vout6}=-(C61\text{Vin61}+C62\text{Vin62}+C63\text{Vin63})/C64 \qquad (2)$$

Here, Vin61 to Vin63 and Vout6 are voltages defined with reference to the reference voltage Vr. Also it is defined that the capacitance ratio of capacitances C61, C62, C63, and C64 is 1:1:1:3. A normalized output of the inverted addition value can be obtained as in formula (3).

$$\text{Vout6}=-(\text{Vin61}+\text{Vin62}+\text{Vin63})/3 \qquad (3)$$

By the normalization, the maximum voltage is limited by the supply voltage.

An output of the last stage I63 is connected to the ground through a grounded capacitance C65. An output of the second stage inverter I62 is connected to the supply voltage Vdd and the ground through a pair of balancing resistances R61 and R62. Unstable oscillation of the inverted amplifying circuit including a feedback line is thereby prevented.

Figure 7:
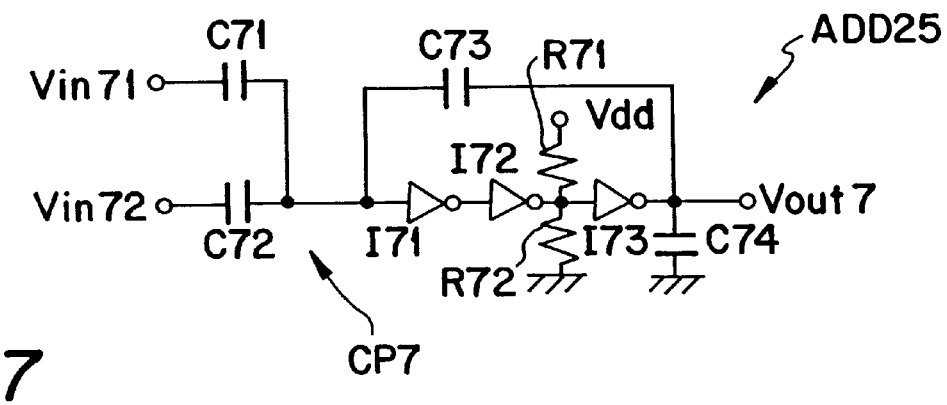
FIG. 7 shows the fifth adder in FIG. 2.

As shown in FIG. 7, the addition portion ADD25 includes a capacitive coupling CP7 which includes capacitances C71 and C72 of a number corresponding to the number of the addition portions ADD21 and ADD23. The output of CP7 is connected to three stages of serial MOS inverters I71,I72, and I73. An output of MOS inverter I73 of the last stage is connected to an input of I71 through a feedback capacitance C73. An output of CP7 is generated at an output of I73 with a good linearity. Assuming input voltages of capacitances C71 and C72 to be Vin71 and Vin72, an output Vout7 of I73 can be expressed by the formula (4).

$$\text{Vout7}=-(C71\text{Vin71}+C72\text{Vin72})/C73 \qquad (4)$$

Here, Vin71, Vin72, and Vout7 are voltages defined with reference to the reference voltage Vr. The capacitance ratio is C71:C72:C73=1:1:2. Then, a normalized output of an inverted addition is obtained as in formula (5).

$$Vout7=-(Vin71+Vin72)/2 \qquad (5)$$

By the normalization, the maximum voltage is limited by the supply voltage.

An output of the last stage inverter I73 is connected to the ground through grounded capacitance C74. An output of the second stage inverter I72 is connected to the supply voltage Vdd and the ground through a pair of balancing resistances R71 and R72. The unstable oscillation of the inverted amplifying circuit including a feedback line is thereby prevented.

Figure 8:
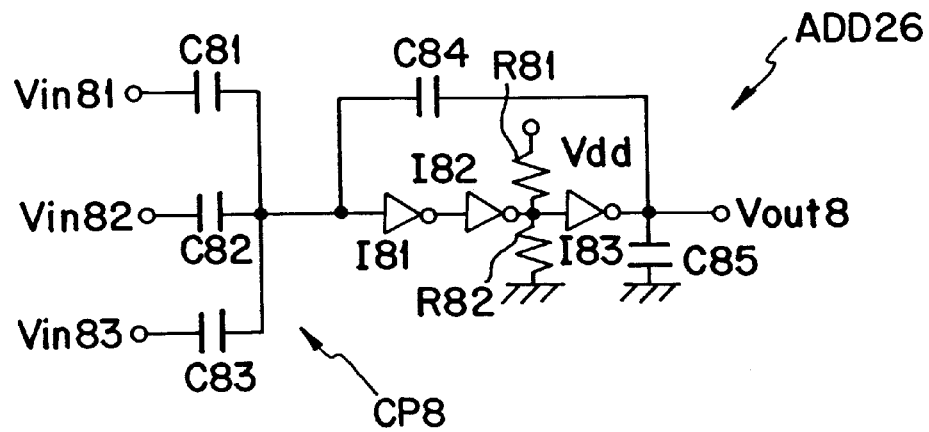
FIG. 8 shows the sixth adder in FIG. 2.

As shown in FIG. 8, addition portion ADD26 includes a capacitive coupling CP8 which includes capacitances C81, C82 and C83 of a number corresponding to the number of addition portions ADD22, ADD24, and ADD25 connected thereto, and an output of CP8 is connected to three stages of serial MOS inverters I81, I82, and I83. An output of MOS inverter I83 of the last stage is connected to an input of I81 through a feedback capacitance C84. An output of CP8 is generated at an output of I83 with a good linearity. Assuming the input voltages of capacitances C81, C82, and C83 (with reference to Vr) to be Vin81, Vin82 and Vin83, an output Vout8 of I83 (with reference to Vr) can be expressed by the formula (6).

$$Vout8=-(C81+C82Vin82+C83Vin83)/C84 \qquad (6)$$

It is defined that the capacitance ratio is C81:C82:C83:C84=1:1:2:2. A normalized output of the inverted addition value can be obtained as in formula (7).

$$Vout8=-(Vin81+Vin82-2Vin83)/2 \qquad (7)$$

Here, the weight of C83 is defined to be twice as large as C81 and C82 so as to cancel the influence of the normalization by ADD25 and to agree with the unnormalized V81 and V82. By the normalization, the maximum voltage is limited by the supply voltage.

An output of the last stage inverter I83 is connected to the ground through a grounded capacitance C85. An output of the second stage inverter I82 is connected to the supply voltage Vdd and the ground through a pair of balancing resistances R81 and R82. The unstable oscillation of the inverted amplifying circuit including feedback is thereby prevented.

Figure 9:
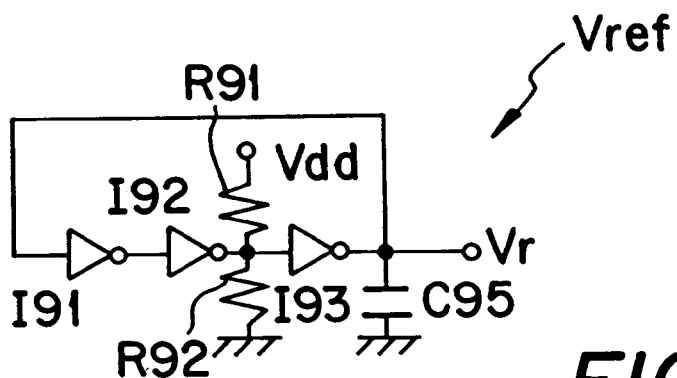
FIG. 9 shows a circuit for generating the reference voltage.

The reference voltage Vr is generated by a reference voltage generating circuit Vref as in FIG. 9. The reference voltage generating circuit includes three stages of serial inverters I91, I92 and I93, and an output of the last stage is fed back to the input of the first stage. Similarly to the inverted amplifying portions, unstable oscillation is prevented by a grounded capacitance C95 and balancing resistances R91 and R92. The output of the reference voltage circuit converges to a stable point on which an input and an output voltage are equal to each other, and any reference voltage can be generated by changing the threshold of each inverter. Generally, in many cases, it is settled that Vr=Vdd/2 in order to keep dynamic range large enough in both the positive and negative directions. Here, Vdd is the supply voltage of an MOS inverter.

Figure 10:
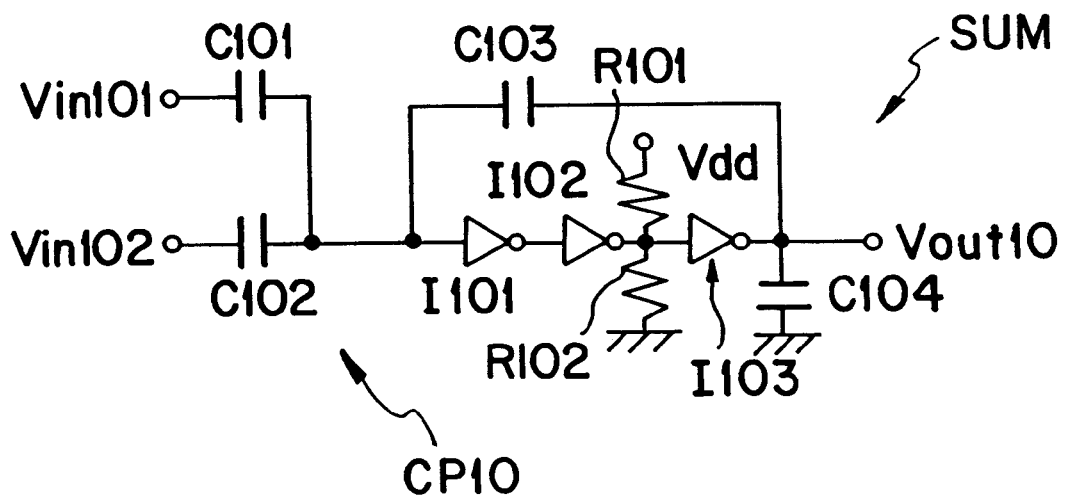
FIG. 10 shows an accumulation circuit in FIG. 1.

As shown in FIG. 10, the accumulation circuit SUM includes a capacitive coupling CP10 which includes capacitances C101 and C102 of a number corresponding to the number of filters MF1 and MF2. The output of CP10 is connected to three stages of serial MOS inverters I101, I102, and I103. An output of MOS inverter I103 of the last stage is connected to an input of I101 through a feedback capacitance C103. An inversion of an output of CP10 is generated at an output of I103 with a good linearity. Assuming the input voltages of capacitances C101 and C102 to be Yin101 and Vin102, an output Vout10 of I103 can be expressed by the formula (8).

$$Vout10=-(C101Vin101+C102Vin72)/C103 \qquad (8)$$

Here, Vin101, Vin102, and Vout10 are voltages defined with reference to the reference voltage Vr. The capacitance ratio is C101:C102:C103=1:1:2. Then, a normalized output of an inverted addition is obtained as in formula (9).

$$Vout10=(Vin101+Vin102)/2 \qquad (9)$$

By the normalization, the maximum voltage is limited by the supply voltaqe.

An output of the last stage inverter I103 is connected to the ground through a grounded capacitance C104. An output of the second stage inverter I102 is connected to the supply voltage Vdd and the ground through a pair of balancing resistances R101 and R102. The unstable oscillation of the inverted amplifying circuit including a feedback line is thereby prevented.

In the matched filter circuit as described above, the size of the circuit is largely reduced as compared to a digital one because addition is performed by an analog system of capacitive coupling, and the processing speed is high because of the use of parallel addition. As the inputs and outputs of the sampling and holding circuits and addition portions are all voltage signals, electric power consumption is low.

The accuracy of an output of an addition portion depends on the dispersion in characteristics of the MOS inverters and in the capacitance ratios of the capacitances. The dispersion of the inverter characteristics can be minimized by placing them closely to one another. The accuracy of the capacitance ratios can be improved by dispersively connecting a plurality of unit capacitances.

Figure 11:
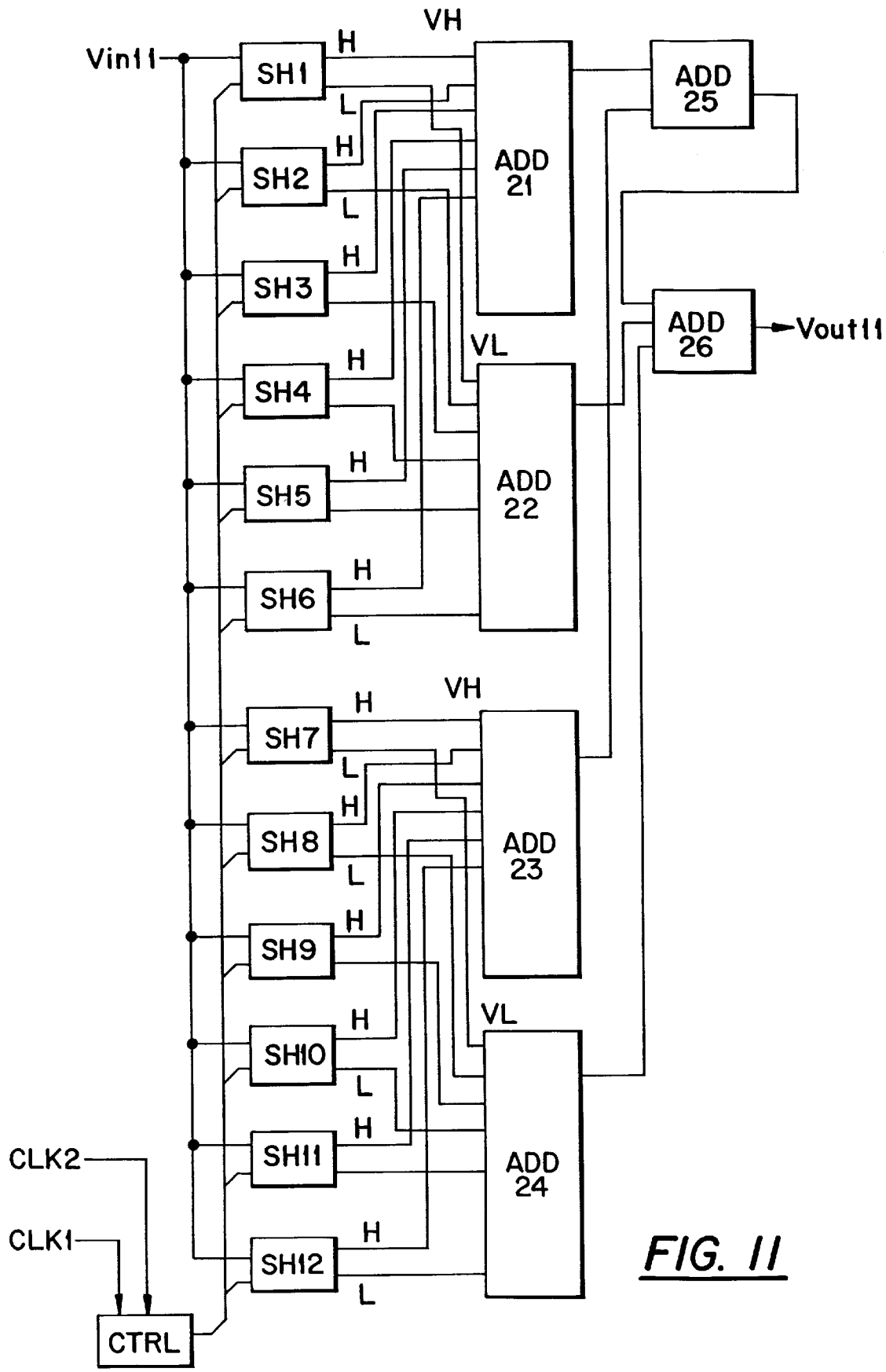
FIG. 11 shows a circuit of the second embodiment.

FIG. 11 shows a matched filter circuit structured in one unit for double-sampling as the second embodiment.

In the second embodiment, the number of sampling and holding circuits is twice as many as those in FIG. 2, and they are parallelly connected to an input voltage Vin11. The sampling and holding circuits are classified into two groups: the first group of SH1 to SH6 and the second group of SH7 to SH12. The first group is driven by the clock CLK1 (not shown), and the second group is driven by the clock CLK2. That is, the first and second groups are driven by timings shifted by Tc/2 from each other. High outputs VH of sampling and holding circuits SH1 to SH6 are inputted to an addition portion ADD21 and added, and low outputs VL are inputted to an addition portion ADD22 and added. Likewise, high outputs VH of sampling and holding circuits SH7 to SH12 are inputted to an addition portion ADD23 and added, and low outputs VL are inputted to an addition portion ADD24 and added. Outputs of ADD21 and ADD23 are added by ADD25, and outputs of ADD22 and ADD24 are inputted to ADD26 together with an output of ADD25. In adders from ADD21 to ADD24, the number of capacitances in the capacitive coupling is increased to 6, which is more than the number of the circuit in FIG. 6. Therefore, the capacitance of feedback capacitance C64 is settled to be twice as large as that in FIG. 6. Adders ADD25 and ADD26 are the same structures as in FIG. 7 and FIG. 8, respectively.

As in the second embodiment, when a single-unit structure is adopted, it is effective to realize a circuit of small size and high speed. As in the first embodiment, when two matched filters are used in parallel, it is possible to apply them flexibly to a higher rate of sampling.

In a matched filter circuit according to the present invention, sampling and holding circuits are classified into two groups, the control circuit alternatively closes the switches in the first group by a chip time in sequence, and at the same time, alternatively closes the switches in the second group by a time shifted by ½ chip time in sequence. Therefore, it is possible to perform double-sampling.

What is claimed is:

1. A matched filter circuit for spread spectrum communication, comprising:

(A) a plurality of sampling and holding circuits, each comprising:
   (i) a switch connected to an input voltage,
   (ii) a first capacitance connected to an output of said switch,
   (iii) a first inverted amplifying portion connected to an output of said first capacitance, said first inverted amplifying portion having an odd number of stages of MOS inverters,
   (iv) a first feedback capacitance for connecting an output of said first inverted amplifying portion to an input of said first inverted amplifying portion,
   (v) a first multiplexer for alternatively outputting the output of said first inverted amplifying portion or a reference voltage, and
   (vi) a second multiplexer for alternatively outputting the output of said first inverted amplifying portion or the reference voltage;

(B) a first addition portion comprising:
   (i) a plurality of second capacitances corresponding to said plurality of sampling and holding circuits, each of said plurality of second capacitances being connected to an output of one of said plurality of sampling and holding circuits,
   (ii) a second inverted amplifying portion to which outputs of said plurality of second capacitances are commonly connected, said second inverted amplifying portion having an odd number of stages of MOS inverters, and
   (iii) a second feedback capacitance for connecting an output of said second inverted amplifying portion to an input of said second inverted amplifying portion;

(C) a second addition portion comprising:
   (i) a plurality of third capacitances corresponding to said plurality of sampling and holding circuits, each of said plurality of third capacitances being connected to an output of the second multiplexer of one of said plurality of sampling and holding circuits,
   (ii) a third inverted amplifying portion to which outputs of said plurality of third capacitances are integrated and connected, said third inverted amplifying portion having an odd number of stages of MOS inverters, and
   (iii) a third feedback capacitance for connecting an output of said third inverted amplifying portion to an input of said third inverted amplifying portion;

(D) a subtraction portion for subtracting an output of said second addition portion from an output of said first addition portion; and (E) a control circuit for closing said switch in one of said plurality of sampling and holding circuits, opening other switches, and switching said first and second multiplexers of each one of said plurality of sampling and holding circuits by a predetermined combination;

wherein each of said plurality of sampling and holding circuits is classified into a first group and a second group, said control circuit successively closing the switch of one of said plurality of sampling and holding circuits in said first group every chip time and successively closing the switch of one of said plurality of sampling and holding circuits in said second group at a timing shifted by ½ chip time from a timing of said first group.

2. A matched filter circuit as claimed in claim 1, wherein the reference voltage is generated by a reference voltage generating circuit which comprises (a) a fourth inverted amplifying portion having an odd number of stages of MOS inverters and (b) a fourth feedback capacitance for connecting an output of said fourth inverted amplifying portion to an input of said fourth inverted amplifying portion.

3. A matched filter circuit as claimed in claim 1, at least one among said plurality of sampling and holding circuits further comprising:

a grounded capacitance connected between (a) the output of said first inverted amplifying portion and (b) a ground potential,
   wherein an output of at least one of said odd number of stages of MOS inverters of said first inverted amplifying portion before a last of said odd number of stages of MOS inverters of said first inverted amplifying portion is connected to a supply voltage and the ground potential by a pair of balancing resistances.

4. A matched filter circuit as claimed in claim 3, wherein the reference voltage is settled to be substantially ½ of a source voltage of said MOS inverters.

5. A matched filter circuit as claimed in claim 1, wherein said control circuit controls said plurality of sampling and holding circuits so that a status of said plurality of sampling and holding circuits circulatingly changes.

6. A matched filter circuit as claimed in claim 1, wherein in at least one of said plurality of sampling and holding circuits (1) said first multiplexer alternatively outputs (1a) said output of said first inverted amplifying portion and (1b) the reference voltage, and (2) said second multiplexer alternatively outputs (2a) said output of said first inverted amplifying portion and (2b) the reference voltage by a selection inverse to that of said first multiplexer.

7. A matched filter circuit as claimed in claim 1, wherein in at least one of said sampling and holding circuits (a) one of said first and second multiplexers outputs the output of said first inverted amplifying portion, or (b) both of said first and second multiplexers output the reference voltage.

8. A matched filter circuit for spread spectrum communication, comprising:

(A) a plurality of sampling and holding circuits, each sampling and holding circuit comprising:
   (i) a switch connected to an input voltage,
   (ii) a first capacitance connected to an output of said switch,
   (iii) a first inverted amplifying portion connected to an output of said first capacitance, said first inverted amplifying portion having an odd number of stages of MOS inverters,
   (iv) a first feedback capacitance for connecting an output of said first inverted amplifying portion to an input of said first inverted amplifying portion,
   (v) a first multiplexer for alternatively outputting the output of said first inverted amplifying portion or a reference voltage, and (vi) a second multiplexer for alternatively outputting the output of said first inverted amplifying portion or the reference voltage;
(B) a first addition portion comprising:
(i) a plurality of second capacitances, each of said plurality of second capacitances being connected at least indirectly to the first multiplexer of one of said plurality of sampling and holding circuits;
(ii) a second inverted amplifying portion to which outputs of said plurality of second capacitances are connected, said second inverted amplifying portion having an odd number of stages of MOS inverters; and
(iii) a second feedback capacitance for connecting an output of said second inverted amplifying portion to an input of said second inverted amplifying portion;
(C) a second addition portion comprising:
(i) a plurality of third capacitances, each of said plurality of third capacitances being connected at least indirectly to the second multiplexer of one of said plurality of sampling and holding circuits;
(ii) a linking capacitance, to which an output of said first addition portion is connected;
(iii) a third inverted amplifying portion to which outputs of said plurality of third capacitances and said linking capacitance are connected, said third inverted amplifying portion having an odd number of stages of MOS inverters; and
(iv) a third feedback capacitance for connecting an output of said third inverted amplifying portion to an input of said third inverted amplifying portion; and
(D) a control circuit for closing said switch in one of said plurality of sampling and holding circuits, opening other switches, and switching said first and second multiplexers of each one of said plurality of sampling and holding circuits by a predetermined combination;
wherein said plurality of sampling and holding circuits is divided into a first group and a second group, and
wherein said control circuit successively closes the switch of one of said plurality of sampling and holding circuits in said first group every chip time, and successively closes the switch of one of said plurality of sampling and holding circuits in said second group at a timing shifted by ½ chip time from a timing of said first group.

9. A matched filter circuit as claimed in claim 8, said matched filter circuit further comprising:
(I) a third addition portion to which an output of said first multiplexer of each of said sampling and holding circuits in said first group is connected, said third addition portion comprising:
(a) a plurality of fourth capacitances, each being connected to the output of said first multiplexer of one of said plurality of sampling and holding circuits in said first group;
(b) a fourth inverted amplifying portion having an odd number of serial MOS inverters, to which outputs of said plurality of fourth capacitances are connected; and
(c) a fourth feedback capacitance for connecting an output of said fourth inverted amplifying portion to an input of said fourth inverted amplifying portion, and
(II) a fourth addition portion to which an output of said second multiplexer of each of said sampling and holding circuits in said first group is connected, said fourth addition portion comprising:

(a) a plurality of fifth capacitances, each being connected to the output of said second multiplexer of one of said plurality of sampling and holding circuits in said first group;
(b) a fifth inverted amplifying portion having an odd number of serial MOS inverters, to which outputs of said plurality of fifth capacitances are connected; and
(c) a fifth feedback capacitance for connecting an output of said fifth inverted amplifying portion to an input of said fifth inverted amplifying portion;
(III) a fifth addition portion to which an output of said first multiplexer of each of said sampling and holding circuits in said second group is connected, said third addition portion comprising:
(a) a plurality of sixth capacitances, each being connected to the output of said first multiplexer of one of said plurality of sampling and holding circuits in said second group;
(b) a sixth inverted amplifying portion having an odd number of serial MOS inverters, to which outputs of said plurality of sixth capacitances are connected; and
(c) a sixth feedback capacitance for connecting an output of said sixth inverted amplifying portion to an input of said sixth inverted amplifying portion, and
(IV) a sixth addition portion to which an output of said second multiplexer of each of said sampling and holding circuits in said second group is connected, said fourth addition portion comprising:
(a) a plurality of seventh capacitances, each being connected to the output of said second multiplexer of one of said plurality of sampling and holding circuits in said second group;
(b) a seventh inverted amplifying portion with an odd number of serial MOS inverters, to which outputs of said plurality of seventh capacitances are connected; and
(c) a seventh feedback capacitance for connecting an output of said seventh inverted amplifying portion to an input of said seventh inverted amplifying portion;
wherein outputs of said third addition portion and of said fifth addition portion are inputted to said first addition portion, and outputs of said fourth portion and of said sixth addition portion are inputted to said second addition portion.

10. A matched filter circuit as claimed in claim 8, wherein the reference voltage is generated by a reference voltage generating circuit which comprises a fourth inverted amplifying portion having an odd number of stages of MOS inverters and a fourth feedback capacitance for connecting an output of said fourth inverted amplifying portion to an input of said fourth inverted amplifying portion.

11. A matched filter circuit as claimed in claim 9, wherein the reference voltage is generated by a reference voltage generating circuit which comprises a eighth inverted amplifying portion having an odd number of stages of MOS inverters and an eighth feedback capacitance for connecting an output of said eighth inverted amplifying portion to an input of said eighth inverted amplifying portion.

12. A matched filter circuit as claimed in claim 8, at least one among said plurality of sampling and holding circuits further comprising:
a grounded capacitance connected between (a) the output of said first inverted amplifying portion and (b) a ground potential,
wherein an output of at least one of said odd number of stages of MOS inverters of said first inverted amplifying portion before a last of said odd number of stages of MOS inverters of said first inverted amplifying portion is connected to a supply voltage and the ground potential by a pair of balancing resistances.

13. A matched filter circuit as claimed in claim 9, at least one among said plurality of sampling and holding circuits further comprising:
   a grounded capacitance connected between (a) the output of said first inverted amplifying portion and (b) a ground potential,
   wherein an output of at least one of said odd number of stages of MOS inverters of said first inverted amplifying portion before a last of said odd number of stages of MOS inverters of said first inverted amplifying portion is connected to a supply voltage and the ground potential by a pair of balancing resistances.

14. A matched filter circuit as claimed in claim 12, wherein said reference voltage is settled to be substantially ½ of a source voltage of said MOS inverters.

15. A matched filter circuit as claimed in claim 13, wherein said reference voltage is settled to be substantially ½ of a source voltage of said MOS inverters.

16. A matched filter circuit as claimed in claim 8, wherein said control circuit controls said plurality of sampling and holding circuits so that a status of said plurality of sampling and holding circuits circulatingly changes.

17. A matched filter circuit as claimed in claim 9, wherein said control circuit controls said plurality of sampling and holding circuits so that a status of said plurality of sampling and holding circuits circulatingly changes.

18. A matched filter circuit as claimed in claim 8, wherein in at least one of said plurality of sampling and holding circuits (1) said first multiplexer alternatively outputs (1a) said output of said first inverted amplifying portion and (1b) the reference voltage, and (2) said second multiplexer alternatively outputs (2a) said output of said first inverted amplifying portion and (2b) the reference voltage by a selection inverse to that of said first multiplexer.

19. A matched filter circuit as claimed in claim 9, wherein in at least one of said plurality of sampling and holding circuits (1) said first multiplexer alternatively outputs (1a) said output of said first inverted amplifying portion and (1b) the reference voltage, and (2) said second multiplexer alternatively outputs (2a) said output of said first inverted amplifying portion and (2b) the reference voltage by a selection inverse to that of said first multiplexer.

20. A matched filter circuit as claimed in claim 8, wherein in at least one of said plurality of sampling and holding circuits (a) one of said first and second multiplexers outputs said output of said first inverted amplifying portion, or (b) both of said first and second multiplexers output the reference voltage.

21. A matched filter circuit as claimed in claim 9, wherein in at least one of said sampling and holding circuits (a) one of said first and second multiplexers outputs said output of said first inverted amplifying portion, or (b) both of said first and second multiplexers output the reference voltage.

* * * * *